(12) United States Patent
Chen

(10) Patent No.: US 11,917,811 B2
(45) Date of Patent: Feb. 27, 2024

(54) DYNAMIC RANDOM ACCESS MEMORY AND METHOD FOR MANUFACTURING THE SAME

(71) Applicant: Winbond Electronics Corp., Taichung (TW)

(72) Inventor: Huang-Nan Chen, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 314 days.

(21) Appl. No.: 17/389,015

(22) Filed: Jul. 29, 2021

(65) Prior Publication Data

US 2023/0031883 A1 Feb. 2, 2023

(51) Int. Cl.
*H10B 12/00* (2023.01)
(52) U.S. Cl.
CPC ....... *H10B 12/315* (2023.02); *H10B 12/0335* (2023.02); *H10B 12/482* (2023.02)
(58) Field of Classification Search
None
See application file for complete search history.

(56) References Cited

U.S. PATENT DOCUMENTS

2014/0231892 A1 8/2014 Song et al.
2015/0214291 A1* 7/2015 Park ................. H01L 24/02
257/503

* cited by examiner

*Primary Examiner* — Steven M Christopher
(74) *Attorney, Agent, or Firm* — Muncy, Geissler, Olds & Lowe, P.C.

(57) ABSTRACT

A dynamic random access memory (DRAM) and its manufacturing method are provided. The DRAM includes bit line contact structures, bit line structures, first insulating structures, a capacitor contact structure, a first connecting pad, a second insulating structure, and a capacitor structure. The bit line structure extends along a first direction. The first insulating structure extends along a second direction that intersects the first direction. The capacitor contact structure is located between two of the bit lines and two of the first insulating structures. The first connecting pad is formed on the capacitor contact structure. The second insulating structure surrounds the first connecting pad, in which the top width of the second insulating structure is greater than the bottom width thereof.

18 Claims, 9 Drawing Sheets

DYNAMIC RANDOM ACCESS MEMORY AND METHOD FOR MANUFACTURING THE SAME

BACKGROUND

Technical Field

The present disclosure is related to a memory device, and in particularly related to a dynamic random access memory and a method for manufacturing the same.

Description of the Related Art

With the scaling down of memory devices, it becomes more difficult to improve the performance and yield of the memory devices. For example, in dynamic random access memory (DRAM), the bit line structure has a sidewall spacer formed by nitride/oxide/nitride. In wet etching, the oxide is less resistant to wet etching than the nitride, so the top of oxide in the sidewall spacer is often damaged, resulting in the top of sidewall spacer becoming thinner or being completely removed (i.e., the top surface of the sidewall spacer is lower than the top surface of the cap layer above the conductive structure). If the top of sidewall spacer of the bit line structure is completely removed, the top of cap layer in the bit line structure will be exposed, resulting in the possibility that the cap layer may also be distorted (e.g., the cap layer has a rounded top surface). As a result, the top of connecting pads on the opposite sides of the bit line structure is wider than expected. In other words, the distance between the top of adjacent connecting pads will become closer. This increases the risk of the short circuit in the memory devices, thereby reducing the performance and yield of the product. As the memory devices scaling down, the distance between the adjacent connecting pads will become smaller, and therefore, the short circuit problem will become more serious.

BRIEF SUMMARY

The present disclosure provides a dynamic random access memory device and its manufacturing method, which may reduce the risk of short circuit and facilitate the scaling down of the memory devices.

A dynamic random access memory includes a plurality of bit line contact structures on a substrate; a plurality of bit line structures on the bit line contact structures and extending along a first direction; a plurality of first insulating structures on the substrate and extending along a second direction crossing the first direction; a capacitor contact structure on the substrate and between adjacent bit line structures and adjacent first insulating structures; a first connecting pad on the capacitor contact structure; a second insulating structure surrounding the first connecting pad and a top width of the second insulating structure being greater than a bottom width of the second insulating structure; and a capacitor structure on the first connecting pad and electrically connecting the first connecting pad.

A manufacturing method for forming a dynamic random access memory is also provided. The manufacturing method for forming a dynamic random access memory includes forming a plurality of bit line contact structures on a substrate; forming a plurality of bit line structures on the bit line contact structures, wherein each of the bit line structures extends along a first direction; forming a plurality of first insulating structures on the substrate, wherein each of the first insulating structures extends in a second direction crossing the first direction; forming a capacitor contact structure on the substrate, wherein the capacitor contact structure is between adjacent bit line structures and adjacent first insulating structures; forming a first connecting pad on the capacitor contact structure; forming a second insulating structure surrounding the first connecting pad, wherein a top width of the second insulating structure is greater than a bottom width of the second insulating structure; and forming a capacitor structure on the first connecting pad and electrically connecting the first connecting pad.

In the dynamic random access memory and its manufacturing method provided in the embodiments of the present disclosure, the risk of short circuit may be reduced by forming a second insulating structure surrounding the first connecting pad. Furthermore, by having the top width of the second insulating structure greater than the bottom width of the second insulating structure, the first connecting pad and the capacitor structure may have a suitable contact resistance and the parasitic capacitance between the bit line structure and the first connecting pad may be reduced. As such, the performance and yield may be improved.

DETAILED DESCRIPTION

Figure 1:
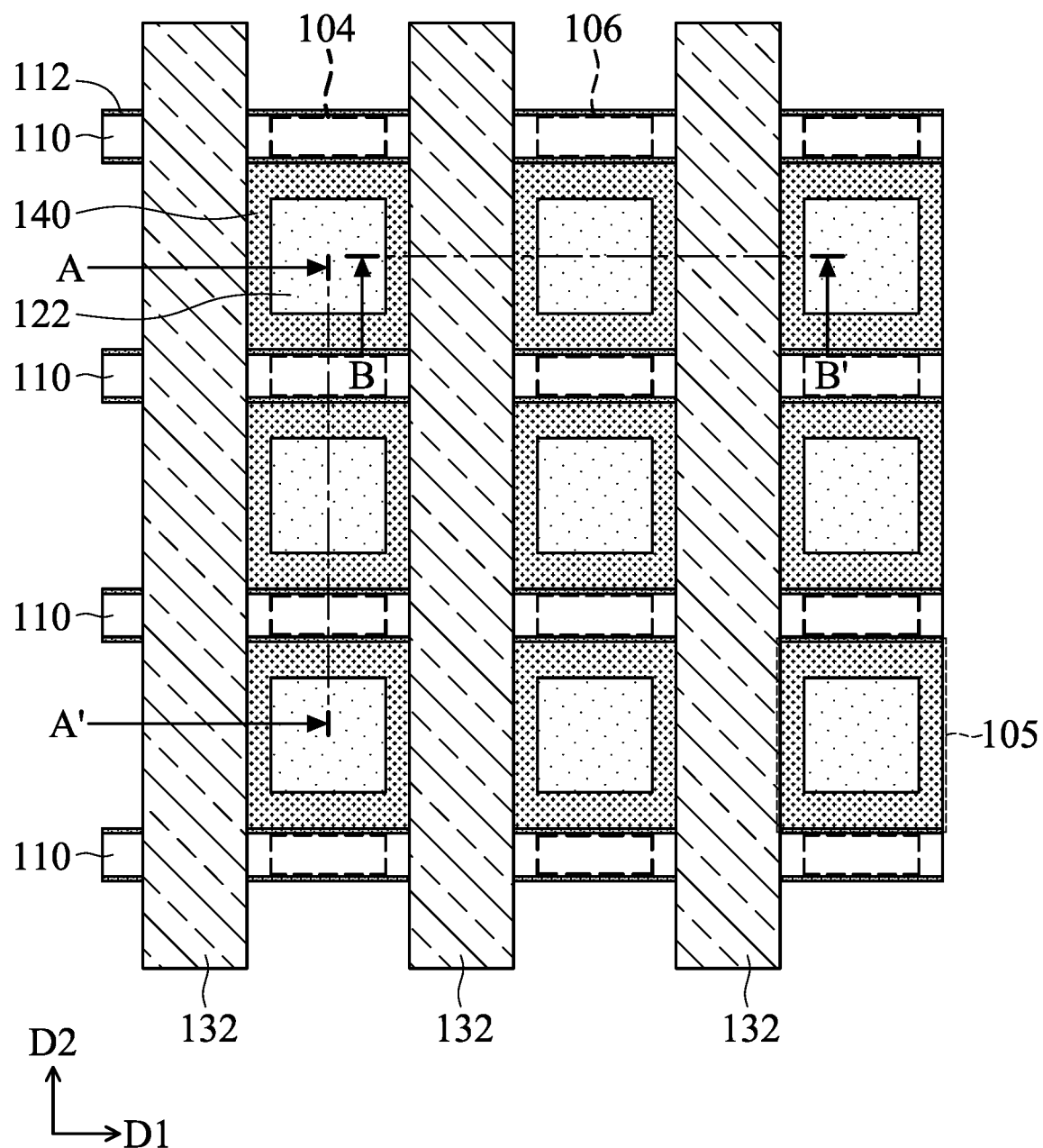
FIG. 1 illustrates a top view of a dynamic random access memory according to some embodiments of the present disclosure.

The present disclosure provides a dynamic random access memory (DRAM) and a method for manufacturing the same. For the sake of simplicity, only the bit line contact structure 104, the insulating pattern 106, the insulating cap layer 110, the insulating spacer 112, the first connecting pad 122, the first insulating structure 132, and the second insulating structure 140 are shown in FIG. 1. Referring to FIG. 1, along with FIG. 2A, an insulating pattern 106 and a bit line contact structure 104 are alternately formed on a substrate 102. The bit line contact structure 104 is configured to electrically connect the substrate 102 to the subsequently formed bit line structure.

The material of the substrate 102 may include silicon, silicon-containing semiconductor, silicon on insulator (SOI), another suitable material, or a combination thereof. In this embodiment, the substrate 102 is silicon substrate. In some embodiments, a shallow trench isolation (STI) structure and a buried word line may be formed in the substrate 102. In some embodiments, other structures may also be formed in substrate 102. For example, the p-well region, the n-well region, or the conductive region may be formed in the substrate 102 by the implantation process. For the sake of simplicity, the STI structure, the buried word line, and the other structures described above are not shown in the figures, and the structures in the substrate 102 and their formation methods are not described in detail herein.

The material of the insulating pattern 106 may include oxide, nitride, oxynitride, carbide, another suitable insulating material, or a combination thereof. In this embodiment, the insulating pattern 106 is silicon nitride. In other embodiments, the insulating pattern 106 is a two-layer structure formed by a silicon oxide and a silicon nitride on the silicon oxide. The material of the bit line contact structure 104 may include doped polycrystalline silicon, another suitable conductive material, or a combination thereof. In order to adjust the work function and the resistance within a suitable range, the material of the bit line contact structure 104 may be different from the material of the subsequently formed conductive structure 108 of the bit line structure. For example, the material of the bit line contact structure 104 may be doped polycrystalline silicon.

Next, a conductive structure 108 is formed on the insulating pattern 106 and on the bit line contact structure 104, and insulating cap layers 110 are formed on the conductive structure 108. The insulating cap layers 110 are formed parallel to each other on the substrate 102, and each of the insulating cap layers 110 extends along a first direction D1.

In some embodiments, the conductive structure 108 may be formed by a single material. In such embodiments, the material of the conductive structure 108 may include tungsten, aluminum, copper, gold, silver, another suitable metal material, or an alloy thereof. In other embodiments, the conductive structure 108 includes a first conductive layer and a second conductive layer on the first conductive layer. In such embodiments, the material of the first conductive layer may include titanium, titanium nitride, tungsten nitride, tantalum or tantalum nitride, another suitable conductive material, or a combination thereof. The material of the second conductive layer may include tungsten, aluminum, copper, gold, silver, another suitable metal material, or an alloy or combination thereof. In this embodiment, the conductive structure 108 is formed by tungsten. The material of the insulating cap layer 110 may include oxide, nitride, oxynitride, another suitable insulating material, or a combination thereof. In this embodiment, the insulating cap layer 110 is silicon nitride. Each of the conductive structure 108 and the insulating cap layer 110, independently, may be formed by chemical vapor deposition (CVD) processes, physical vapor deposition (PVD) processes, atomic layer deposition (ALD) processes, other suitable deposition processes, or a combination thereof.

Then, an insulating spacer 112 is conformally formed on the respective sidewalls of the bit line contact structure 104, the insulating pattern 106, the conductive structure 108, and the insulating cap layer 110. In this disclosure, the conductive structure 108, the insulating cap layer 110, and the insulating spacer 112 are collectively referred to as the bit line structure. In some embodiments, a first spacer layer 112a, a second spacer layer 112b, and a third spacer layer 112c may be formed sequentially to form the insulating spacer 112. The first spacer layer 112a, the second spacer layer 112b, and the third spacer layer 112c, independently, may be formed by CVD process, PVD process, ALD process, or a combination thereof, and after the deposition process, the insulating spacer 112 may be formed using any known etching process to expose the respective top surfaces of the substrate 102 and the insulating cap layer 110. The first spacer layer 112a, the second spacer layer 112b, and the third spacer layer 112c, independently, may include oxide, nitride, oxynitride, carbide, another suitable insulating material, or a combination thereof.

In this embodiment, the first spacer layer 112a and the third spacer layer 112c are both nitrides, and the second spacer layer 112b is oxide. During the fabrication of the insulating spacer 112 in this embodiment, since the removal rate of the second spacer layer 112b is greater than the other spacer layers and the thickness of the third spacer layer 112c is thinner than the other spacer layers, and thus, the top surfaces of the second spacer layer 112b and the third spacer layer 112c are lower than the top surface of the first spacer layer 112a. In other embodiments, the top surface of the insulating spacer 112 is lower than the top surface of the insulating cap layer 110, i.e., the insulating spacer 112 exposes the top sidewall of the insulating cap layer 110, and the insulating cap layer 110 has a rounded top surface.

Figure 2A:
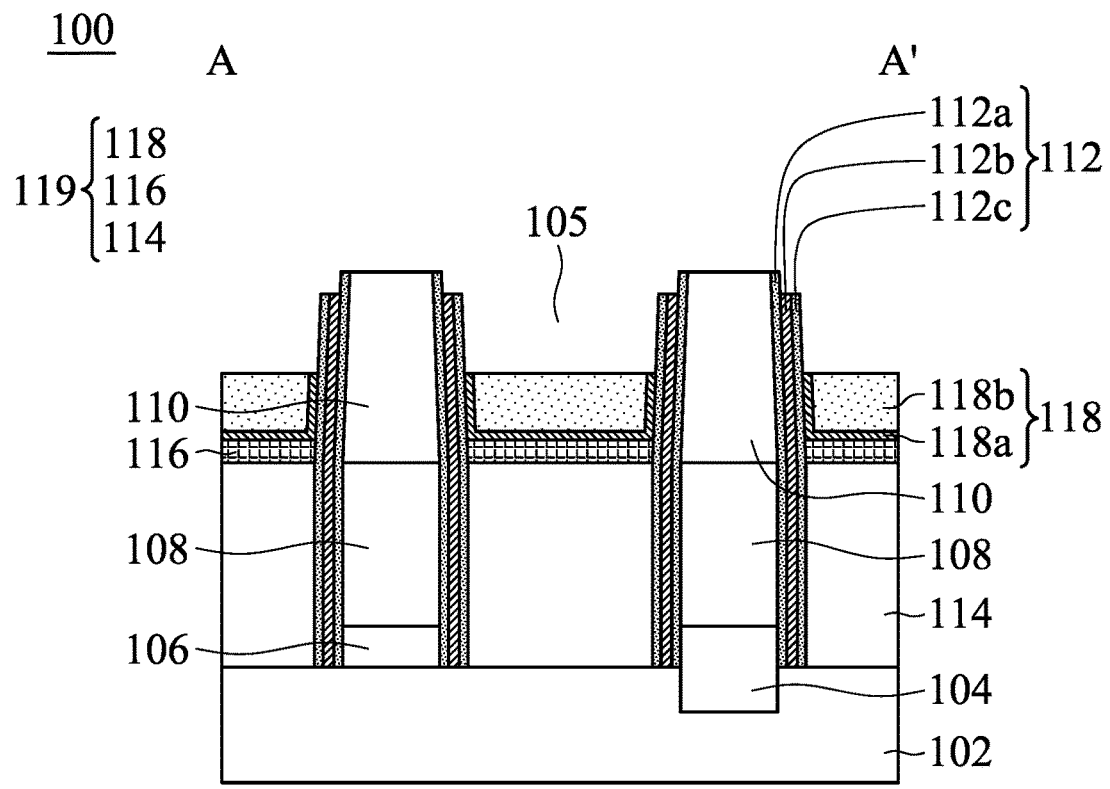
FIGS. 2A, 2B, 2C, 2D, 2E, 2F, and 2G illustrate cross-sectional views of a dynamic random access memory at various stages of the process along line A-A' in FIG. 1 according to one embodiment of the present disclosure.
Figure 3:
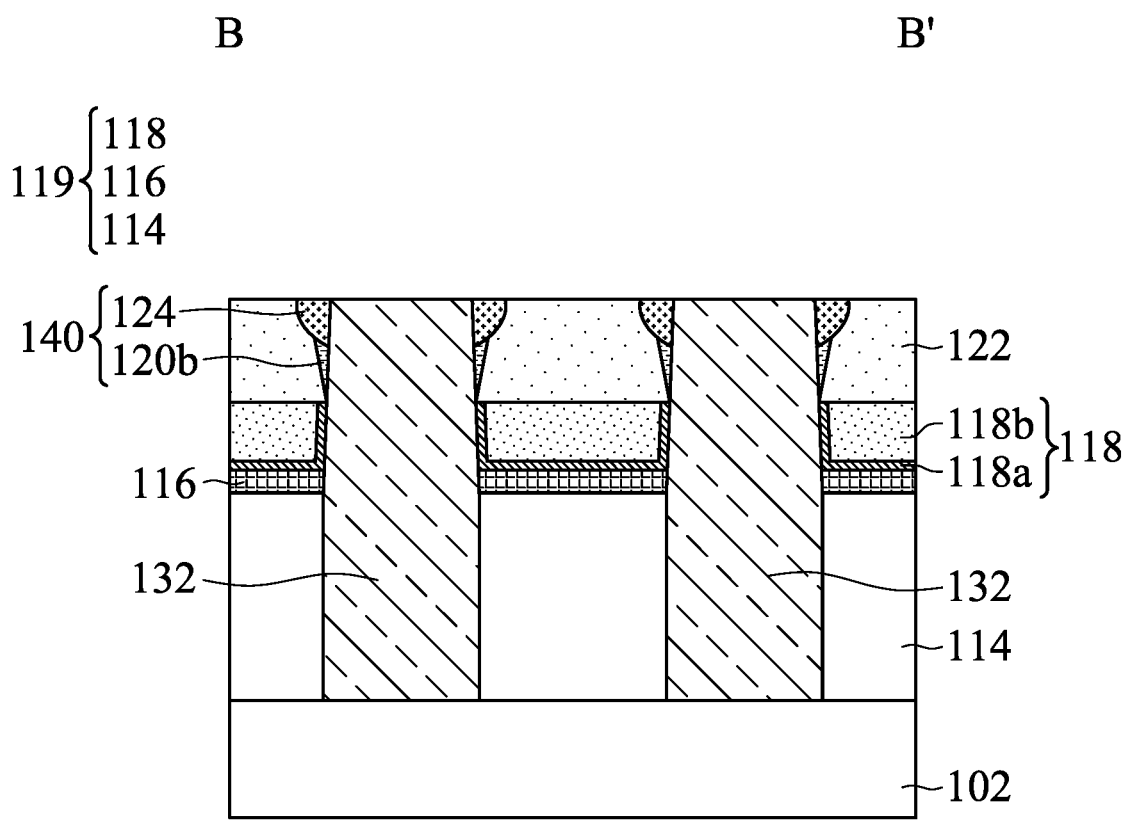
FIG. 3 illustrates a cross-sectional view of a dynamic random access memory along line B-B' in FIG. 1 according to some embodiments of the present disclosure.

Referring to FIG. 1, along with FIGS. 2A and 3, after the insulating spacer 112 is formed, a plurality of first insulating structures 132 are formed on the substrate 102. These first insulating structures 132 are formed parallel to each other on the substrate 102, and each of the first insulating structures 132 extends along a second direction D2 crossing the first direction D1. As such, a contact region 105 is defined between two adjacent insulating cap layers 110 and two adjacent first insulating structures 132. In detail, the contact region 105 is defined between the two insulating spacers 112 provided on the different insulating cap layers 110 and the two adjacent first insulating structures 132. In addition, at this stage, the contact region 105 is a recessed region relative to the insulating cap layer 110 and the first insulating structure 132.

Then, a capacitor contact structure 119 electrically connecting to the substrate 102 is formed in the contact region 105, and the top surface of the capacitor contact structure 119 is lower than the top surface of the insulating cap layer 110. In this embodiment, the capacitor contact structure 119 includes a first contact feature 114, a buffer layer 116, and a second contact feature 118 formed on the substrate 102 sequentially. The steps for forming the first contact feature 114 include, for example, forming a conductive material on the substrate 102 and etching back a portion of the conductive material to form the first contact feature 114 in the contact region 105. The material of the first contact feature 114 may be the same as or similar to the material of the bit line contact structure 104. In this embodiment, the material of the first contact feature 114 is doped polycrystalline silicon in order to adjust the work function and resistance within a suitable range.

The top surface of the second contact feature 118 is lower than the top surface of the insulating cap layer 110. In this embodiment, the second contact feature 118 includes a conductive liner layer 118a and a conductive layer 118b. The steps of forming the second contact feature 118 may include conformally forming a conductive liner material covering the buffer layer 116 in the contact region 105. Next, the conductive material is formed on the conductive liner material. Thereafter, the conductive liner material and the conductive layer material are partially removed by an etching back process. The material of the buffer layer 116 is, for example, metal silicide. The conductive liner material may include titanium, titanium nitride, tungsten nitride, tantalum, tantalum nitride, or a combination thereof. The conductive layer material may include tungsten, aluminum, copper, gold, silver, another suitable metal material, or an alloy or combination thereof. Through the capacitor contact structure 119, the substrate 102 may be electrically connected to the subsequently formed capacitor structure 130 (shown in FIG. 2G).

Figure 2B:
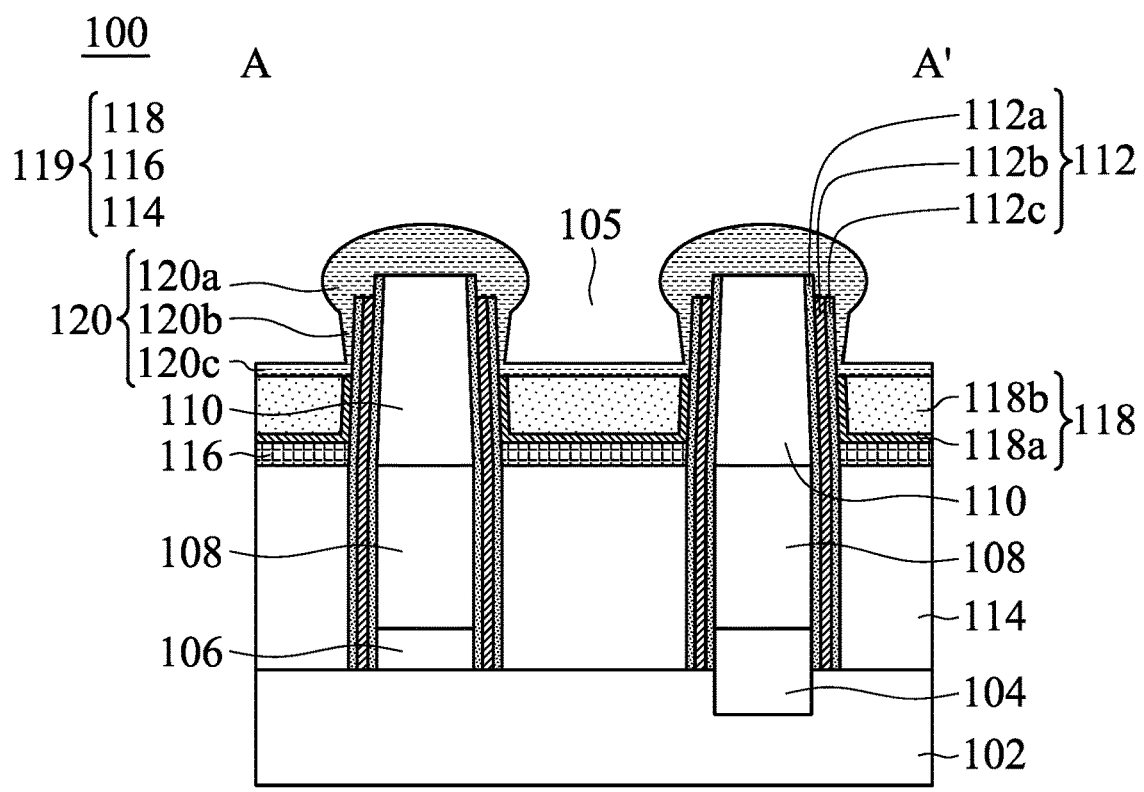

Referring to FIG. 2B, a first material layer 120 with non-uniform thickness is formed on the insulating cap layer 110, the insulating spacer 112, and the capacitor contact structure 119. The overhang portion 120a of the first material layer 120 is formed on the top of insulating cap layer 110. A tapered portion 120b of the first material layer 120 is formed on the sidewalls of the insulating spacer 112. A horizontal portion 120c of the first material layer 120 is formed on the top surface of the capacitor contact structure 119. The maximum thickness of the overhang portion 120a is greater than the maximum thickness of the tapered portion 120b. The first material layer 120 with the overhang portion 120a is conducive to increasing the yield, which will be discussed in more detail below.

In one embodiment, in order to efficiently form the first material layer 120 with the overhang portion 120a, the first material layer 120 may be formed by a method with poor step coverage, e.g., plasma-enhanced chemical vapor deposition (PECVD). In one embodiment, the first material layer 120 is not completely removed in a subsequent process, and the remaining portion of the first material layer 120 becomes a portion of a subsequently formed second insulating structure. The first material layer 120 may include a first insulating material, such as oxide, nitride, oxynitride, another suitable insulating material, or a combination thereof. In this embodiment, the first material layer 120 includes oxide.

Figure 2C:
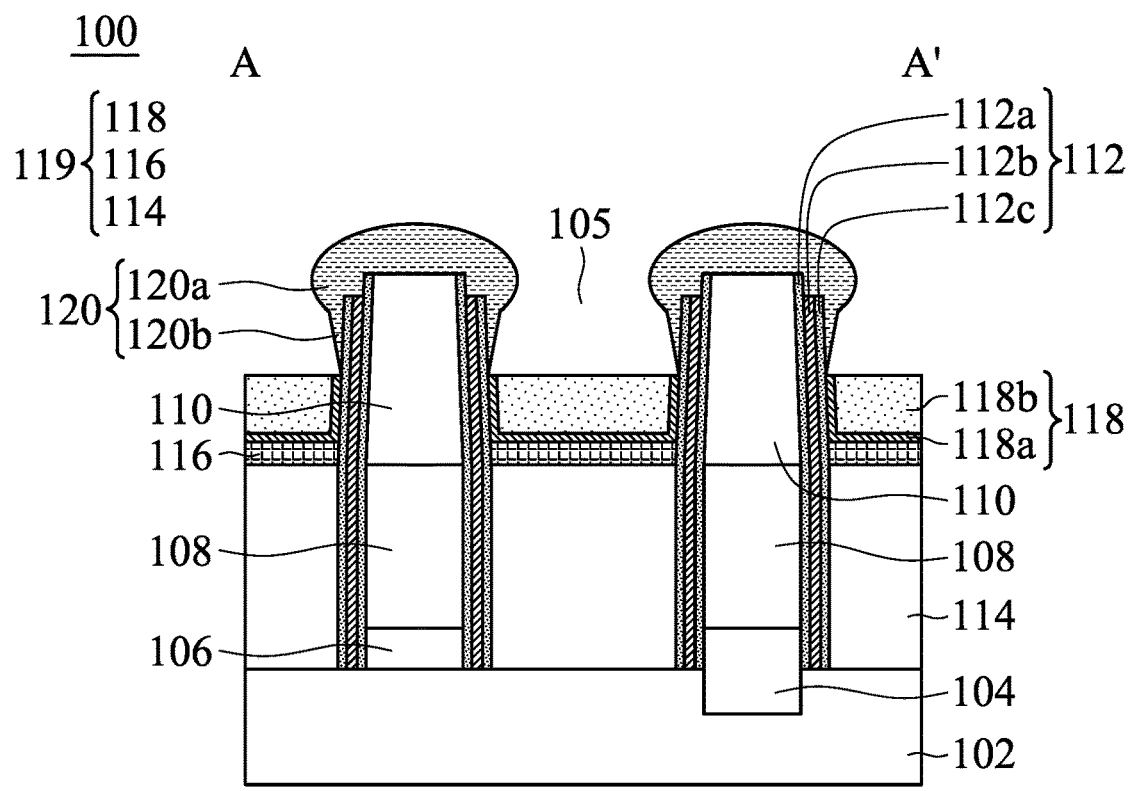

Referring to FIG. 2C, a first etching process is performed to partially remove the first material layer 120 and expose the top surface of the capacitor contact structure 119. In more detail, after the first etching process, the horizontal portion 120c of the first material layer 120 is completely removed and the top surface of the second contact feature 118 is exposed. The first etching process may be an isotropic etching process, such as wet etching process.

Figure 2D:
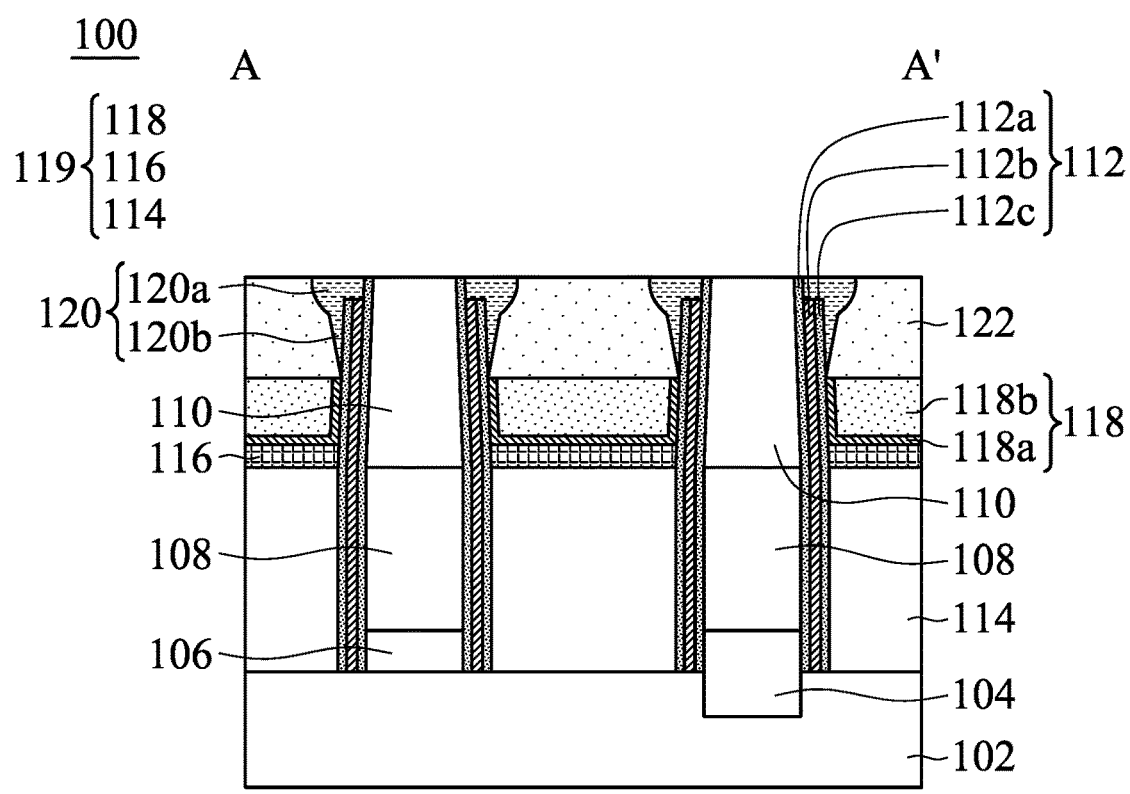

Referring to FIG. 2D, the first connecting pad 122 is formed on the capacitor contact structure 119, and the top surface of the first connecting pad 122 is coplanar with the top surface of the insulating cap layer 110. The steps of forming the first connecting pad 122 may include depositing a conductive material on the first material layer 120 and the capacitor contact structure 119 to fill the contact region 105. Then, a planarization process is performed so that the top surface of the first material layer 120, the top surface of the insulating cap layer 110, and the top surface of the first connecting pad 122 are coplanar. The conductive materials may include tungsten, aluminum, copper, gold, silver, another suitable metal material, or an alloy or combination thereof. In this embodiment, the conductive material is tungsten.

Figure 2E:
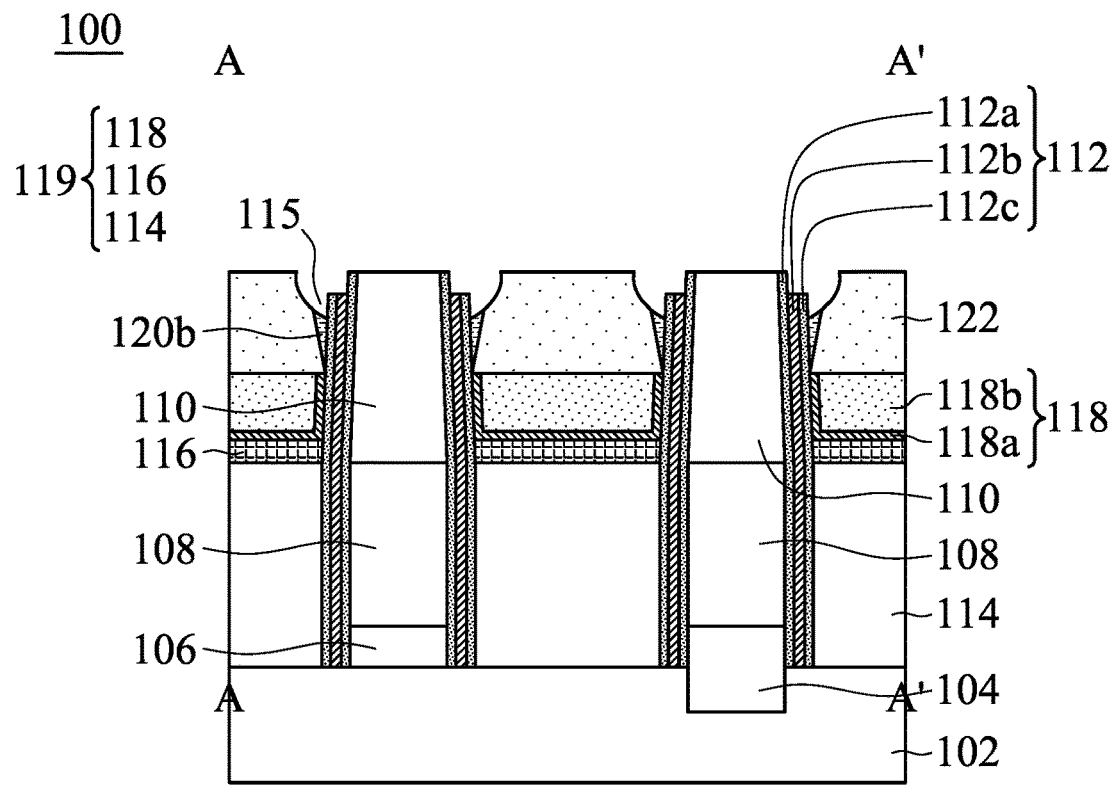

Referring to FIG. 2E, a second etching process is performed to remove the first material layer 120 and form a recess 115 that exposes the insulating spacer 112. In this embodiment, the second etching process removes the overhang portion 120a of the first material layer 120 and the recess 115 further exposes the tapered portion 120b of the first material layer 120.

Figure 2F:
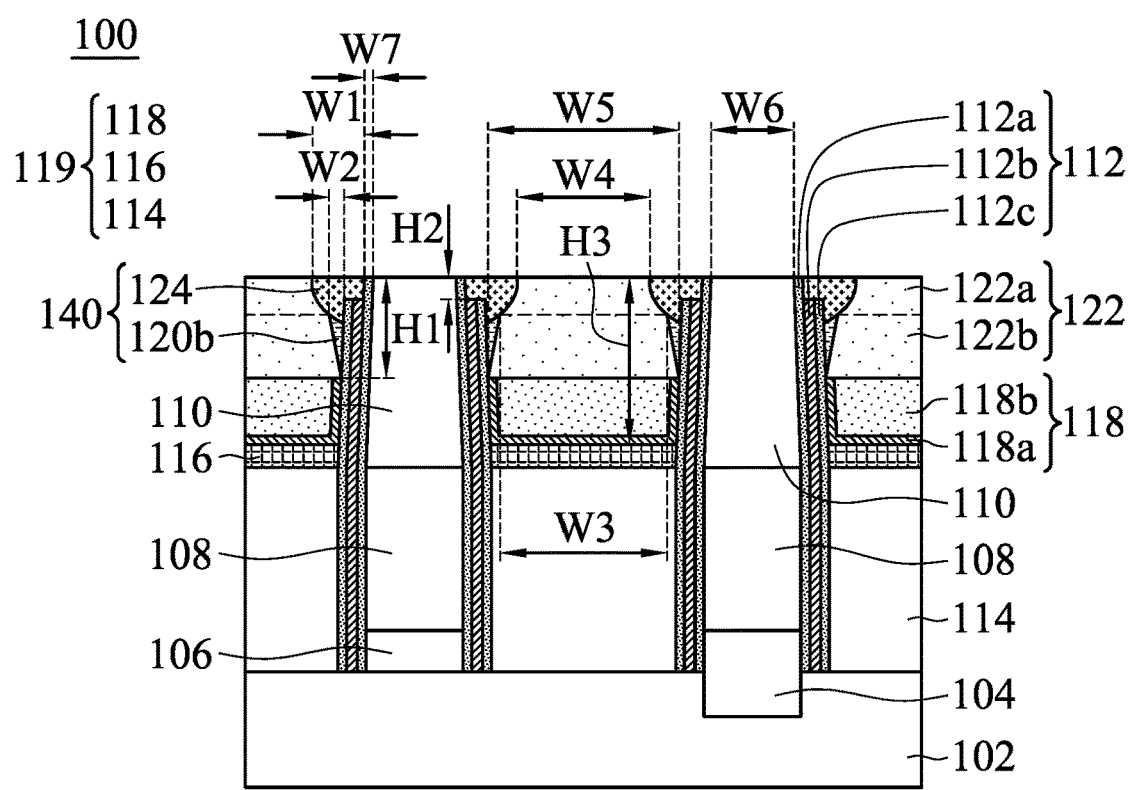

Referring to FIG. 2F, the recess 115 is filled with the second insulating material 124, and the top surface of the second insulating material 124, the top surface of the insulating cap layer 110, and the top surface of the first connecting pad 122 are coplanar. In order to protect the first material layer 120 from the subsequent etching process, the second insulating material 124 may be different from the material of the first material layer 120. The second insulating material 124 may include oxide, nitride, or oxynitride. In this embodiment, the second insulating material 124 is nitride. The second insulating material 124 may be formed by a suitable deposition process. Examples include CVD, PVD, ALD, and combinations thereof.

Referring to FIG. 1, along with FIG. 2F, in this embodiment, the tapered portion 120b of the first material layer 120 and the second insulating material 124 form a second insulating structure 140 surrounding the first connecting pad 122. This second insulating structure 140 is formed between the first connecting pad 122 and the insulating cap layer 110. The top width of the second insulating structure is greater than the bottom width of the second insulating structure. The second insulating structure 140 of the embodiments of the present disclosure is conducive to increasing the yield, which will be discussed in more detail below.

Figure 2G:
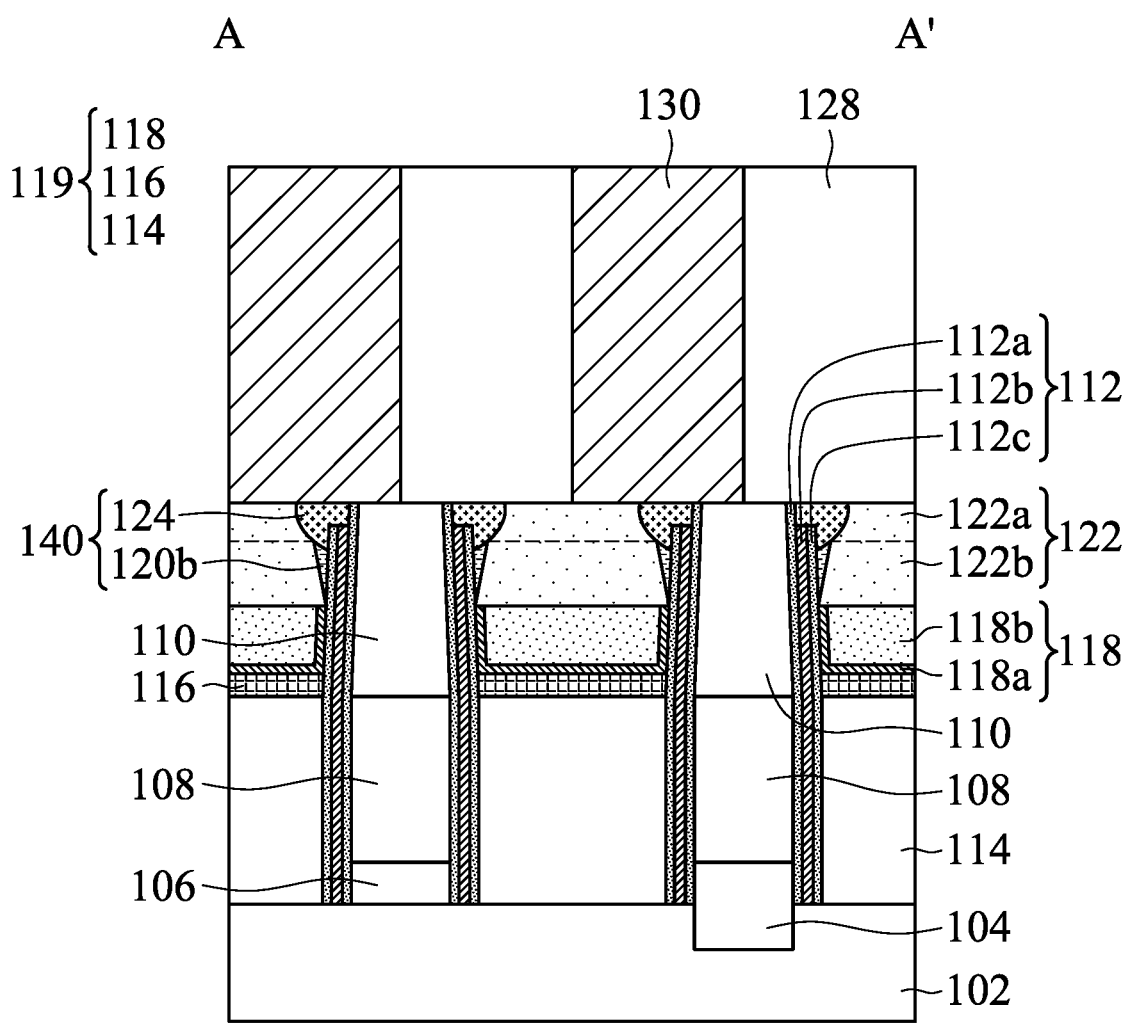

Referring to FIG. 2G, after the second insulating structure 140 is formed, the interlayer dielectric layer 128 is formed on the substrate 102. Next, a third etching process is performed on the interlayer dielectric layer 128 to form a plurality of openings that expose the first connecting pad 122. The capacitor structure 130 may be electrically connected to the capacitor contact structure 119 through the first connecting pad 122.

In this embodiment, the material of the interlayer dielectric layer 128 is different from the material of the second insulating material 124, so that the removal rate of the interlayer dielectric layer 128 is considerably greater than the removal rate of the second insulating material 124 when performing the third etching process. As such, the conductive material in the capacitor structure 130 may be prevented from being formed at the position originally intended to be filled into the second insulating structure 140, thus avoiding the short circuit. Furthermore, during the third etching process, the second insulating material 124 prevents the etchant from entering the substrate 102 through the tapered portion 120b and the second spacer layer 112b. As a result, the yield of the DRAM 100 may be increased. In some embodiments, the ratio R1/R2 of the removal rate R1 of the interlayer dielectric layer 128 to the removal rate R2 of the second insulating material 124 in the third etching process is 1.5 to 20. The material of the interlayer dielectric layer 128 may include oxide, nitride, oxynitride, or a combination thereof. In this embodiment, the interlayer dielectric layer 128 is oxide.

The position range of the capacitor structure 130 may not exactly overlap with the position range of the first connecting pad 122. In this embodiment, the capacitor structure 130 is disposed on the first connecting pad 122, the second insulating structure 140, and the insulating cap layer 110. The capacitor structure 130 may be formed using known methods, which are not described herein. After forming the capacitor structure 130, other known processes may be performed to complete the DRAM 100, and for the sake of simplicity, other known processes are not described herein.

Referring to FIG. 1, along with FIGS. 2G and 3, the DRAM 100 of some embodiments of the present disclosure includes the substrate 102, the bit line contact structure 104, the bit line structure, the first insulating structure 132, the capacitor contact structure 119, the first connecting pad 122, the second insulating structure 140, and the capacitor structure 130. The bit line structure includes the conductive structure 108, the insulating layer 110, and the insulating spacer 112.

The bit line contact structure 104, the conductive structure 108, and the insulating cap layer 110 are sequentially formed on the substrate 102. The bit line structure extends along the first direction D1. The first insulating structure 132 extends along the second direction D2 crossing the first direction D1. The capacitor contact structure 119, the first connecting pad 122 and the second insulating structure 140 are between the two adjacent bit line structures and the two adjacent first insulating structures 132. The insulating spacer 112 is formed on the respective sidewalls of the bit line contact structure 104, the conductive structure 108, and the insulating cap layer 110. The first connecting pad 122 is formed on the capacitor contact structure 119. The top surface of the second insulating structure 140 is level with the top surface of the first connecting pad 122, and the second insulating structure 140 has a width that gradually decrease downwardly. The capacitor structure 130 is formed on the first connecting pad 122 and electrically connected to the first connecting pad 122. Additional details regarding the DRAM 100 may be found in the preceding description of the manufacturing method and will not be repeated.

In the DRAM 100 provided in the embodiments of the present disclosure, by narrowing the top of the first connecting pad 122, and disposing the second insulating structure 140 surrounding the first connecting pad 122, the risk of the short circuit may be reduced, and the parasitic capacitance between the conductive structure 108 and the first connecting pad 122 may be reduced. As a result, the writing speed may be increased and the performance and yield may be improved.

In some embodiments, the second insulating structure 140 includes a first portion and a second portion. The first portion extends upwardly from the top surface of the capacitor contact structure 119, wherein the first portion has a width that gradually increases. The second portion extends downwardly from the top surface of the first connecting pad 122, wherein the second portion has a width that gradually decreases. In the embodiment shown in FIG. 2F, the first portion of the second insulating structure 140 includes the first material layer 120 and the second portion of the second insulating structure 140 includes the second insulating material 124.

As shown in FIG. 2F, the top surface of the second insulating structure 140 has a first width W1. A maximum distance W2 between the surface of the first portion of the second insulating structure 140 and the surface of the third spacer layer 112*c*. The top surface of the insulating cap layer 110 has a sixth width W6. In this embodiment, the distance between the top portions of the two adjacent first connecting pads 122 is the sixth width W6 plus two times the first width W1 plus two times the thickness W7 of the first spacer layer 112*a* (i.e., W6+2*W1+2*W7). In some embodiments, the ratio W1/W2 of the first width W1 to the maximum distance W2 is 1.5-10.0. As such, it is possible to have a suitable distance between the top portions of the two adjacent first connecting pads 122, so that the contact resistance between the first connecting pad 122 and the capacitor structure 130 is suitable and the parasitic capacitance between the conductive structure 108 and the first connecting pad 122 is reduced. Yield and performance may be increased.

In addition, in some other embodiments, before the formation of the capacitor structure 130, a second connecting pad (not shown) may be formed on the first connecting pad 122 and is electrically connected to the first connecting pad 122. In such embodiments, the second connecting pad and the first connecting pad 122 may be disposed in a staggered manner. By forming the second portion of the second insulating structure 140 described in the embodiments of the present disclosure, one second connecting pad may be effectively prevented from being electrically connected to two adjacent first connecting pads 122 at the same time, thus reducing the risk of short circuit and further improving the performance and yield.

In this embodiment, the first connecting pad 122 includes an upper portion 122*a* and a lower portion 122*b*. Since the first connecting pad 122 is in contact with and surrounded by the second insulating structure 140, the upper portion 122*a* of the first connecting pad 122 has a width that gradually decrease upwardly, and the lower portion 122*b* of the first connecting pad 122 also has a width that gradually decrease upwardly. Furthermore, the width of the bottom surface of the first connecting pad 122 may be less than or equal to the width of the top surface of the capacitor contact structure 119. The width W5 of the bottom surface of the first connecting pad 122 may be greater than the width W4 of the top surface of the first connecting pad 122. By the first connecting pad 122 of the embodiments of the present disclosure, the contact resistance between the first connecting pad 122 and the capacitor contact structure 119 may be prevented from being too large, and the risk of the short circuit between two adjacent first connecting pads 122 may be reduced. As such, the performance and yield of DRAM 100 may be further improved.

As shown in FIG. 2F, the first connecting pad 122 has a third width W3 at a junction of the upper portion 122*a* and the lower portion 122*b*. The top surface of the first connecting pad 122 has a width W4. In some embodiments, the ratio W3/W4 of the third width W3 to the width W4 is 1.1-2.5. As such, the first connecting pad 122 may have a suitable resistance so that the top portions of the two adjacent first connecting pads 122 may have a proper distance between each other, and avoid the formation of gaps in the first connecting pad 122, which may more effectively increase the yield and performance.

Referring to both FIGS. 2A and 2B, in this embodiment, the conductive liner layer 118*a* improves adhesion between the conductive layer 118*b* and the third spacer layer 112*c*. Moreover, by forming the second insulating structure 140 on the second contact feature 118, peeling or delamination of the conductive layer 118*b* may also be avoided.

In addition, in this embodiment, the adhesion between the first connecting pad 122 and the second contact feature 118 is greater than the adhesion between the first connecting pad 122 and the second insulating structure 140, and the width of the bottom surface of the first connecting pad 122 is smaller than or equal to the width of the top surface of the second contact feature 118. As such, peeling or delamination of the first connecting pad 122 can be effectively avoided, and the yield of the DRAM 100 can be increased.

As shown in FIG. 2F, the second insulating structure 140 has a first height H1. The total height of the first connecting pad 122 and the second contact member 118 is a third height H3. In order to facilitate the formation of the overhang portion 120*a* of the first material layer 120 and to avoid peeling or delamination of the conductive layer 118*b*, in some embodiments, the top surface of the second contact feature 118 may be level with or lower than the top surface of the second spacer layer 112*b* or the third spacer layer 112*c* after the etching back process. In addition, in some embodiments, the ratio H3/H1 of the third height H3 to the first height H1 is 1.5-5, as such may improve the yield.

In this embodiment, the first portion of the second insulating structure 140 (i.e., the tapered portion 120*b* of the first material layer 120) includes oxide to reduce the parasitic capacitance between the conductive structure 108 and the first connecting pad 122. In addition, the width of the first portion of the second insulating structure 140 may be smaller than the width of the second portion of the second insulating structure 140 in order to reduce the resistance of the first connecting pad 122. As such, the performance may be further improved.

As shown in FIG. 2F, the second portion of the second insulating structure 140 has a minimum thickness H2. In order to effectively block the etchant of the third etching process from damaging the components under the second portion of the second insulating structure 140 (e.g., the second spacer layer 112b and the substrate 102), to reduce the parasitic capacitance between the conductive structure 108 and the first connecting pad 122, and to facilitate the scaling down, in some embodiments, the ratio H1/H2 of the first height H1 to the minimum thickness H2 is 1.5 to 10.0.

Figure 4:
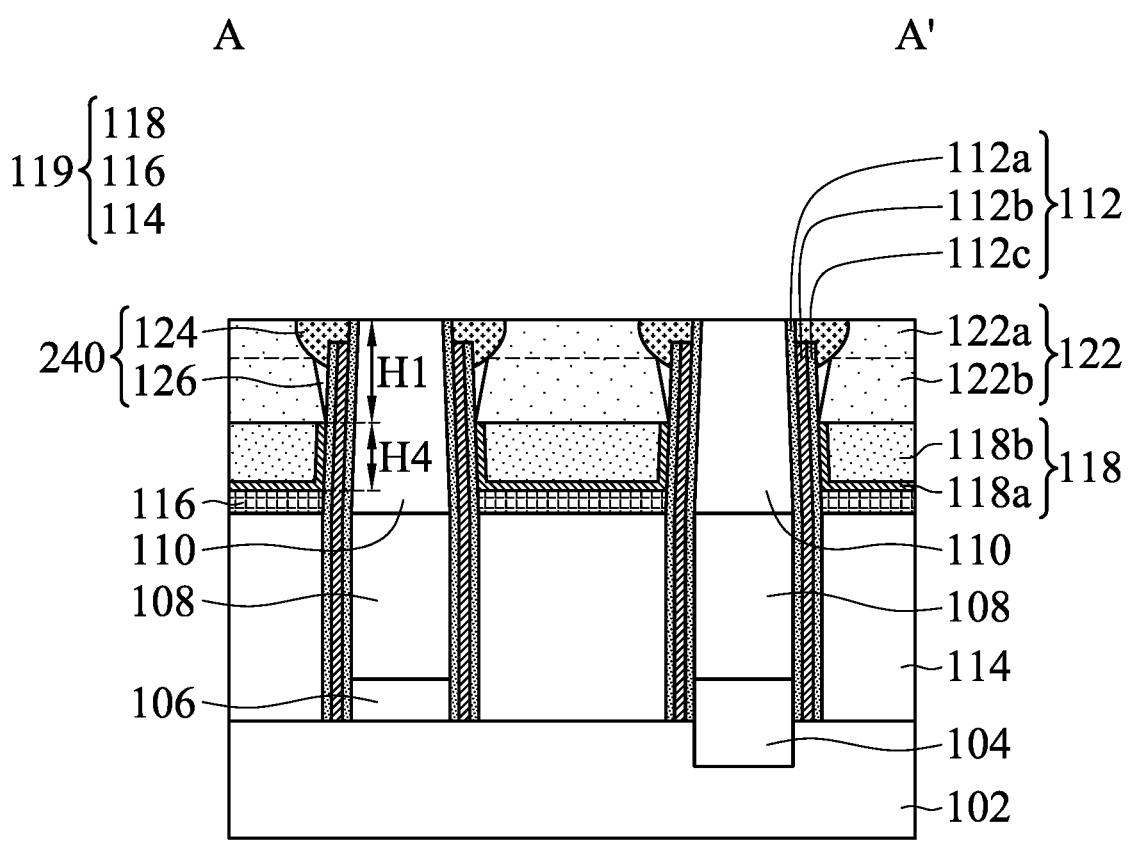
FIGS. 4, 5, and 6 illustrate a cross-sectional view of a dynamic random access memory according to other embodiments of the present disclosure.

The DRAM 200 shown in FIG. 4 is similar to the DRAM 100 shown in FIG. 2F, and thus the same reference numbers are used to indicate the same components. The difference is that the first portion of the second insulating structure 240 in FIG. 4 is formed by the air gap 126. For the sake of simplicity, the same components as shown in FIG. 2F and their manufacturing steps are not described here.

The second insulating structure 240 may be formed by the following process steps. In the second etching process, the first material layer 120 is completely removed and an opening is formed to expose the sidewalls of the first connecting pad 122, where the upper portion of this opening is the recess 115 that exposes the top of insulating spacer 112, and the lower portion is used to form the air gap 126. In this embodiment, the first material layer 120 is completely removed as a sacrificial layer.

In the embodiments of the present disclosure, the second insulating material 124 may be deposited by selecting a method with poor step coverage (e.g., plasma-enhanced chemical vapor deposition (PECVD)), thereby forming the second insulating material 124 in the recess 115, and forming an air gap 126 below the second insulating material 124.

In this embodiment, the first portion of the second insulating structure 240 includes the air gap 126 and the second portion of the second insulating structure 240 includes the second insulating material 124. Compared to the case where the first portion of the insulating structure is formed with oxide, using the air gap 126 as the first portion may further reduce the parasitic capacitance between the conductive structure 108 and the first connecting pad 122. Thereby, the performance may be further improved.

As shown in FIG. 4, the second insulating structure 240 has a first height H1. The second contact feature 118 has a fourth height H4. In some embodiments, the ratio H1/H4 of the first height H1 to the fourth height H4 is 0.5-10.0, so as to avoid peeling or delamination of the second contact feature 118, and to facilitate the formation of the overhang portion 120a of the first material layer 120, thereby improving the yield.

In the embodiments of the present disclosure, the first material layer 120 may include oxide, nitride, oxynitride, carbon-based materials (e.g., graphite or other carbides), polycrystalline silicon, or a combination thereof. Thus, the process is more flexible. In addition, in the embodiments of the present disclosure, the first material layer 120 may be selected from materials that are more likely to form the overhang portion 120a or may be selected from materials that have a higher removal rate during the second etching process, thereby helping to reduce the fabrication time and improve the yield.

Figure 5:
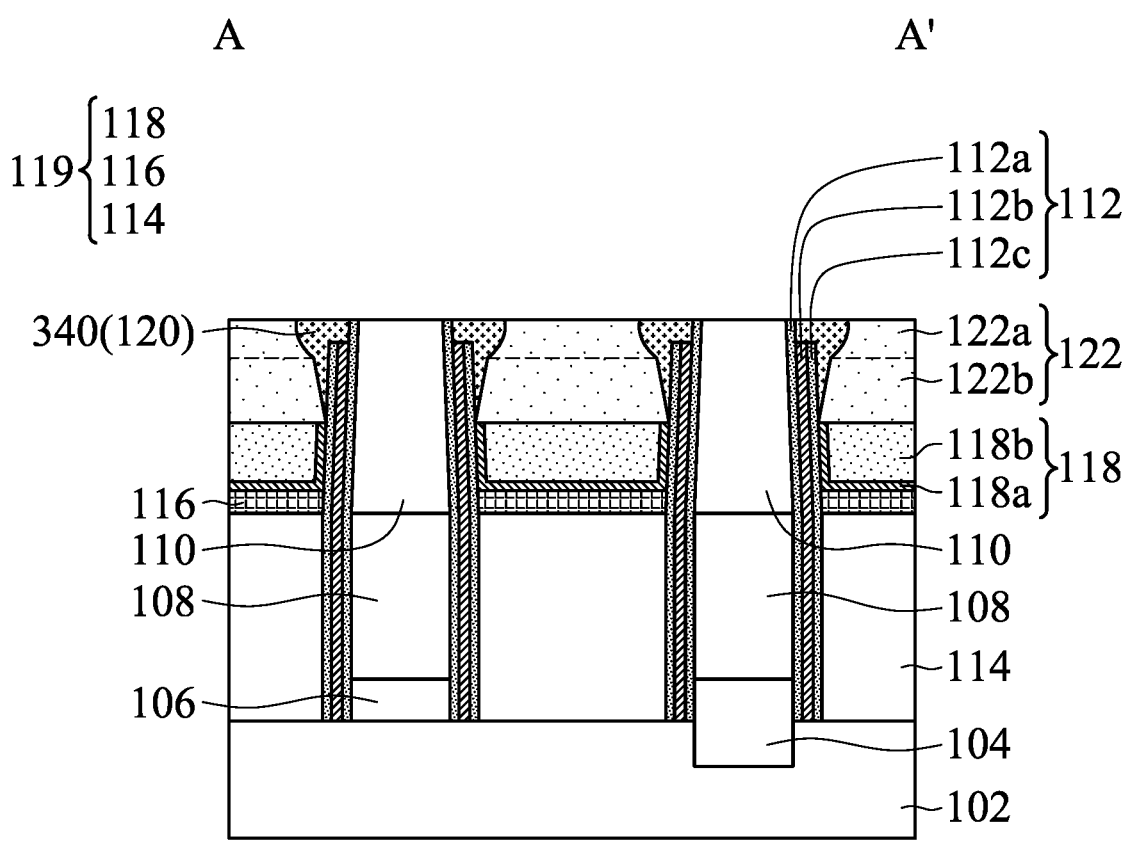

The DRAM 300 shown in FIG. 5 is similar to the DRAM 100 shown in FIG. 2F, and thus the same reference numbers are used to indicate the same components. The difference is that the second insulating structure 340 in FIG. 5 is formed by the first material layer 120 only. For the sake of simplicity, the same components and their process steps as shown in FIG. 2F are not described in detail here.

In the embodiments of the present disclosure, the second insulating structure 340 is formed by the steps as shown in FIG. 2D. Thus, after forming the structure as shown in FIG. 2D, the steps as described in FIGS. 2E and 2F may be omitted and the steps as described in FIG. 2G may be performed directly, as such may simplify the process and reducing production time and cost. In this embodiment, the first material layer 120 is nitride. The material of the first material layer 120 is different from the material of the interlayer dielectric layer, so that when the third etching process is performed, the removal rate of the interlayer dielectric layer is much greater than the removal rate of the second insulating structure 340. As such, the conductive material in the capacitor structure may be prevented from being formed at the position originally intended to be filled into the second insulating structure 340, thus avoiding the short circuit. Furthermore, during the third etching process, the second insulating structure 340 may block the penetration of the etchant into the substrate 102.

Figure 6:
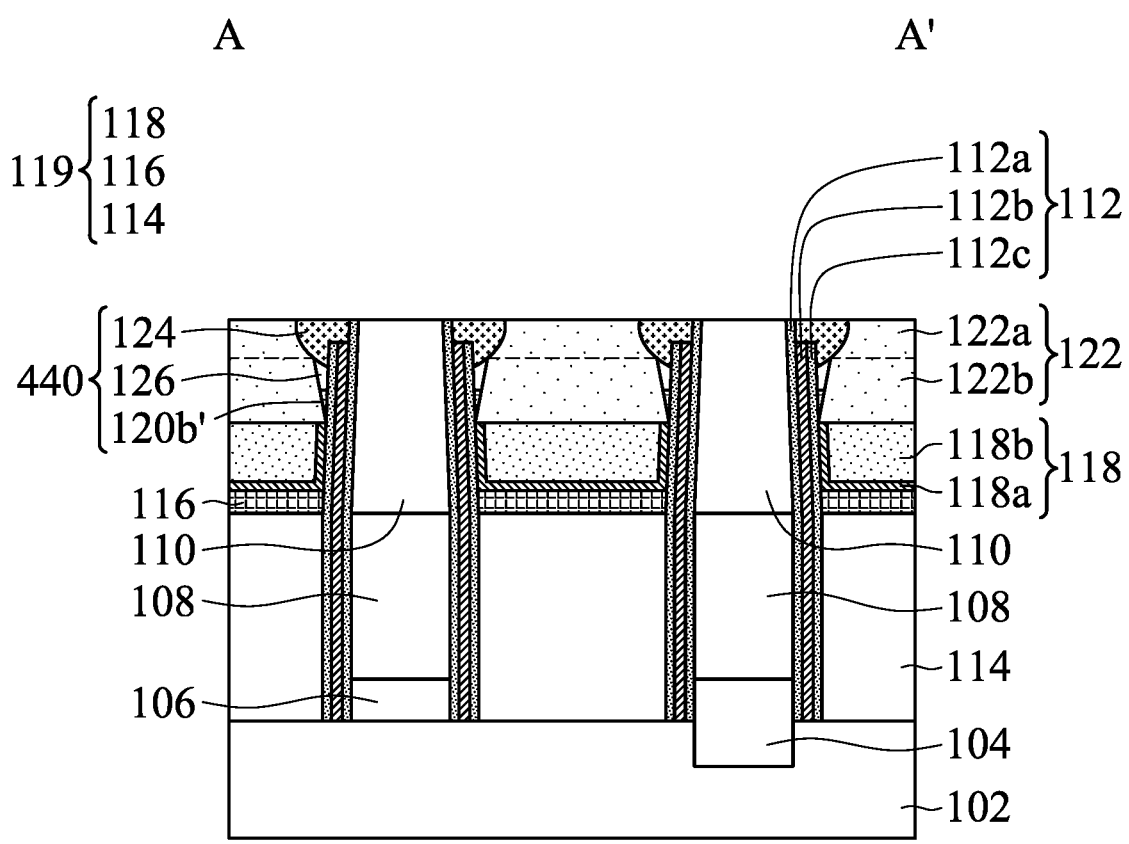

The DRAM 400 shown in FIG. 6 is similar to the DRAM 100 shown in FIG. 2F, and thus the same reference numbers are used to indicate the same components. The difference is that the second insulating structure 440 shown in FIG. 6 includes a first portion, a second portion, and a third portion. The first portion extends upwardly from the top surface of the capacitor contact structure 119. The second portion extends downwardly from the top surface of the first connecting pad 122. The third portion is between the first portion and the second portion. For the sake of simplicity, the same components and their manufacturing steps as shown in FIG. 2F are not described herein.

The second insulating structure 440 may be formed by the following process steps. After forming the structure as shown in FIG. 2D, a second etching process may be performed to partially remove the first material layer 120 and form a recess 115 that exposes a portion of the sidewalls of the first connecting pad 122. Later, the second insulating material 124 is deposited in the recess 115, and the second insulating material 124 does not fully fill the recess 115. If the method with poor step coverage (e.g., plasma-enhanced chemical vapor deposition) is selected to deposit the second insulating material 124, the second insulating material 124 may be formed in the upper portion of the recess 115 and an air gap 126 may be formed in the lower portion of the recess 115. As such, the air gap 126 may be formed between the remaining portion of the first material layer 120b' and the second insulating material 124.

In this embodiment, the first portion of the second insulating structure 440 includes the remaining portion of the first material layer 120b'. The second portion of the second insulating structure 440 includes the second insulating material 124. The third portion of the second insulating structure 440 includes the air gap 126. The second insulating material 124 is different from the first material layer 120. The first material layer 120 may include oxide, nitride, oxynitride, another suitable insulating material, or a combination thereof. The second insulating material 124 may include oxide, nitride, oxynitride, carbide, or another suitable insulating material. In this embodiment, the first material layer 120 is oxide, and the second insulating material 124 is nitride. In this embodiment, the first portion of the second insulating structure 440 is oxide and the third portion is air gap. Thus, the parasitic capacitance between the conductive structure 108 and the first connecting pad 122 may be reduced, thereby improving the performance of the memory device.

In summary, in the manufacturing method of the DRAM provided in the embodiments of the present disclosure, the first material layer having the overhang portion is formed to cover and wrap around the top portion of the insulating cap layer to reduce the risk of the short circuit in the memory devices and to improve the yield. Furthermore, the second insulating structure surrounding the first connecting pad includes a low dielectric constant material to reduce the parasitic capacitance between the bit line and the first connecting pad and to improve the performance of the memory devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dynamic random access memory, comprising:
   a plurality of bit line contact structures on a substrate;
   a plurality of bit line structures on the bit line contact structures and extending along a first direction;
   a plurality of first insulating structures on the substrate and extending along a second direction crossing the first direction;
   a capacitor contact structure on the substrate and between adjacent ones of the bit line structures and adjacent ones of the first insulating structures;
   a first connecting pad on the capacitor contact structure;
   a second insulating structure surrounding the first connecting pad and a top width of the second insulating structure being greater than a bottom width of the second insulating structure; and
   a capacitor structure on the first connecting pad and electrically connecting the first connecting pad, wherein a top surface of the second insulating structure is level with a top surface of the first connecting pad.

2. The memory as claimed in claim 1, wherein the second insulating structure comprises:
   a first portion extending upwardly from a top surface of the capacitor contact structure, wherein the first portion has a width that gradually decreases downwardly; and
   a second portion extending downwardly from the top surface of the first connecting pad, wherein the second portion has a width that gradually decreases downwardly, wherein the top surface of the second insulating structure has a first width W1, wherein a maximum distance W2 is between a surface of the first portion of the second insulating structure and a sidewall surface of the bit line structure, and wherein a ratio (W1/W2) of the first width W1 to the maximum distance W2 is 1.5 to 10.0.

3. The memory as claimed in claim 2, wherein the first portion comprises a first insulating material, the second portion comprises a second insulating material, and the second insulating material is different from the first insulating material.

4. The memory as claimed in claim 2, wherein the first portion comprises an air gap, and the second portion comprises an insulating material.

5. The memory as claimed in claim 2, wherein the first portion comprises a same insulating material as the second portion.

6. The memory as claimed in claim 2, wherein the second insulating structure has a first height H1, the second portion has a minimum thickness H2, and wherein a ratio (H1/H2) of the first height H1 to the minimum thickness H2 is 1.5-10.0.

7. The memory as claimed in claim 2, wherein the second insulating structure further comprises a third portion between the first portion and the second portion, the first portion comprises a first insulating material, the second portion comprises a second insulating material, the third portion comprises an air gap.

8. The memory as claimed in claim 7, wherein the second insulating material is different from the first insulating material.

9. The memory as claimed in claim 1, wherein the bit line structures comprise:
   a conductive structure on the bit line contact structures;
   an insulating cap layer on the conductive structure;
   an insulating spacer between the conductive structure and the capacitor contact structure, and comprising:
     a first spacer layer on a sidewall of the insulating cap layer and on a sidewall of the conductive structure;
     a second spacer layer on the first spacer layer, wherein a top surface of the second spacer layer is lower than a top surface of the first spacer layer; and
     a third spacer layer on the second spacer layer, wherein a top surface of the third spacer layer is lower than the top surface of the first spacer layer.

10. The memory as claimed in claim 1, wherein a width of a bottom surface of the first connecting pad is greater than a width of a top surface of the first connecting pad.

11. The memory as claimed in claim 10, wherein the first connecting pad comprises a lower portion and an upper portion, and a ratio of the width of a junction of the lower portion and the upper portion of the first connecting pad to a width of the top surface of the first connecting pad is 1.1-2.5.

12. A method for forming the dynamic random access memory of claim 1, comprising:
   forming the plurality of bit line contact structures on the substrate;
   forming the plurality of bit line structures on the bit line contact structures, wherein each of the bit line structures extends along the first direction;
   forming the plurality of first insulating structures on the substrate, wherein each of the first insulating structures extends in the second direction crossing the first direction;
   forming the capacitor contact structure on the substrate, wherein the capacitor contact structure is between adjacent ones of bit line structures and adjacent ones of first insulating structures;
   forming the first connecting pad on the capacitor contact structure;
   forming the second insulating structure surrounding the first connecting pad, wherein the top width of the second insulating structure is greater than the bottom width of the second insulating structure; and
   forming the capacitor structure on the first connecting pad and electrically connecting the first connecting pad.

13. The memory as claimed in claim 12, wherein forming the second insulating structure and forming the first connecting pad comprise:

forming a first material layer with non-uniform thickness on the bit line structure and the capacitor contact structure, wherein the first material layer comprises a first insulating material;

performing a first etching process to partially remove the first material layer and expose a top surface of the capacitor contact structure;

depositing a conductive material on the first material layer and the capacitor contact structure;

performing a planarization process so that a top surface of the first material layer is coplanar with a top surface of the conductive material, wherein after the planarization process the conductive material forms the first connecting pad;

performing a second etching process to remove a portion of the first material layer and form a recess adjacent to the first connecting pad; and forming a second insulating material in the recess, wherein the second insulating material is different from the first insulating material, wherein the top surface of the second insulating structure is level with the top surface of the first connecting pad.

14. The method as claimed in claim 13, wherein an overhang portion of the first material layer is removed by the first etching process to form the recess.

15. The method as claimed in claim 13, wherein the second insulating material fills the recess and a remaining portion of the first material layer and the second insulating material form the second insulating structure.

16. The method as claimed in claim 13, wherein the second insulating material does not completely fill the recess, thereby forming an air gap in the recess and between the first material layer and the second insulating material, and wherein a remaining portion of the first material layer, the second insulating material and the air gap form the second insulating structure.

17. The method as claimed in claim 12, wherein forming the second insulating structure and forming the first connecting pad comprise:

forming a first material layer with non-uniform thickness on the bit line structure and the capacitor contact structure;

performing a first etching process to partially remove the first material layer and expose a top surface of the capacitor contact structure;

depositing a conductive material on the first material layer and the capacitor contact structure;

performing a planarization process so that a top surface of the first material layer is coplanar with a top surface of the conductive material, wherein after the planarization process, the conductive material forms the first connecting pad, and the first connecting pad directly contacts the capacitor contact structure;

performing a second etching process to completely remove the first material layer and form an opening exposing a sidewall of the first connecting pad; and forming the second insulating structure in the opening, wherein a material of the second insulating structure is different from a material of the first material layer.

18. The method as claimed in claim 17, wherein forming the second insulating structure in the opening comprises forming an insulating material, and the insulating material does not completely fill the opening, thereby forming an air gap in the opening and below the insulating material, and wherein the insulating material and the air gap form the second insulating structure.

* * * * *